United States Patent
Kim

(10) Patent No.: US 11,789,815 B2
(45) Date of Patent: Oct. 17, 2023

(54) MEMORY CONTROLLER AND MEMORY DEVICE INCLUDING THE SAME

(71) Applicant: SAMSUNG ELECTRONICS CO., LTD., Suwon-si (KR)

(72) Inventor: Ho Youn Kim, Seoul (KR)

(73) Assignee: Samsung Electronics Co., Ltd.

( * ) Notice: Subject to any disclaimer, the term of this patent is extended or adjusted under 35 U.S.C. 154(b) by 50 days.

(21) Appl. No.: 17/681,058

(22) Filed: Feb. 25, 2022

(65) Prior Publication Data

US 2023/0063804 A1    Mar. 2, 2023

(30) Foreign Application Priority Data

Aug. 26, 2021    (KR) ................. 10-2021-0112890

(51) Int. Cl.
*G06F 11/10* (2006.01)
*G06F 11/07* (2006.01)
(Continued)

(52) U.S. Cl.
CPC ........ *G06F 11/1068* (2013.01); *G06F 3/0619* (2013.01); *G06F 3/0656* (2013.01);
(Continued)

(58) Field of Classification Search
CPC ... H03K 19/21; G06F 11/0772; G06F 3/0679; G06F 3/0656; G06F 3/0619; G06F 11/1068
See application file for complete search history.

(56) References Cited

U.S. PATENT DOCUMENTS 6,785,837 B1 * 8/2004 Kilmer ................. G11C 7/1006
714/6.32
7,069,494 B2    6/2006 Cargnoni et al.
(Continued)

FOREIGN PATENT DOCUMENTS

JP    2012118725 A    6/2012
JP    2019149069 A    9/2019

*Primary Examiner* — Guy J Lamarre
(74) *Attorney, Agent, or Firm* — Fish & Richardson P.C.

(57) ABSTRACT

A memory device includes; a memory module including a memory array, and a memory controller that retrieves read data from memory cells of the memory array. The memory controller includes a fault detector that detects faulty addresses associated with faulty memory cells among the memory cells providing data errors. The fault detector includes; a first inverter that generates inverted read data by reading and inverting the read data, wherein the inverted read data is stored in the memory array, a first buffer that stores the read data and provides buffered data, an XOR operator that receives the buffered data from the first buffer, receives read-out inverted data generated by reading the inverted read data stored in the memory array, and performs an XOR operation on the buffered data and the read-out inverted read data to generate calculation data, a fault address detection unit that identifies the faulty addresses in response to the calculation data and generates faulty address information, a second inverter that generates inverted read-out inverted read data by receiving and inverting the read-out inverted read data, and an error pattern change unit that converts an uncorrectable error (UE)-causing data into a correctable error (CE)-causing data.

20 Claims, 17 Drawing Sheets

(51) Int. Cl.
*H03K 19/21* (2006.01)
*G06F 3/06* (2006.01)

(52) U.S. Cl.
CPC ........ *G06F 3/0679* (2013.01); *G06F 11/0772* (2013.01); *H03K 19/21* (2013.01)

(56) References Cited

U.S. PATENT DOCUMENTS

| | | |
|---|---|---|
| 7,574,648 B2 | 8/2009 | Akiyama et al. |
| 8,140,945 B2 | 3/2012 | Cypher |
| 8,612,828 B2 | 12/2013 | Brzezinski |
| 8,756,387 B2 * | 6/2014 | Frost ................... G06F 12/0246 711/111 |
| 8,848,465 B2 | 9/2014 | Kim et al. |
| 9,653,160 B2 * | 5/2017 | Kim ....................... G11C 29/24 |
| 9,658,919 B2 | 5/2017 | Pathirane et al. |
| 10,083,764 B2 * | 9/2018 | Park ....................... G11C 29/76 |
| 10,409,683 B2 * | 9/2019 | Ko ........................ G06F 3/0665 |
| 11,010,243 B2 | 5/2021 | Nakaoka |
| 2012/0266041 A1 * | 10/2012 | Wang ................... G11C 7/1006 714/752 |
| 2015/0007001 A1 * | 1/2015 | Kern ................... H03M 13/159 714/785 |
| 2017/0024273 A1 * | 1/2017 | Han ..................... G06F 11/073 |
| 2020/0409787 A1 * | 12/2020 | Yip ..................... G06F 11/1048 |
| 2021/0026728 A1 | 1/2021 | Kim et al. |
| 2022/0121518 A1 * | 4/2022 | Chung .................. G06F 3/0679 |

* cited by examiner

MEMORY CONTROLLER AND MEMORY DEVICE INCLUDING THE SAME

CROSS-REFERENCE TO RELATED APPLICATION

This application claims priority under 35 U.S.C. § 119 to Korean Patent Application No. 10-2021-0112890 filed on Aug. 26, 2021, the subject matter of is hereby incorporated by reference in its entirety.

BACKGROUND

1. Field

The present disclosure relates to memory controllers and memory devices including same.

2. Description of the Related Art

Component faults are one of the most common causes of error(s) in memory devices. Faulty components may include faulty memory chip(s) and/or faulty data path(s) between memory devices in a memory system. In this regard, a faulty data path may be caused by faulty pin(s), faulty data trace(s), and/or faulty wire(s).

Error(s) may occur in a memory module including multiple memory chips if one or more some of the constituent memory chips are faulty. That is, permanent faults (or hard errors) may occur due to faulty memory chip(s). Permanent faults may be limited only to a single bit or a single column of bits, but may affect multiple bits at identical locations in different chips of a memory device (e.g., a dynamic random access memory (RAM) (DRAM) device).

Thus, in order to improved reliability in error correction, there exists a need for more precisely detecting locations of permanent faults in a memory device (e.g., a DRAM device).

SUMMARY

Embodiments of the present disclosure provide memory controllers capable of improving error correction reliability, other embodiments of the present disclosure provide memory modules capable of providing improved error correction reliability, and still other embodiments of the present disclosure provide memory devices capable of improving error correction reliability.

However, embodiments of the present disclosure are not restricted to those expressly set forth herein.

According to an embodiment of the present disclosure, there is provided a memory device including; a memory module including a memory array, wherein the memory array includes a plurality of memory cells, and a memory controller that retrieves read data from memory cells among the plurality of memory cells, wherein the memory controller includes a fault detector that detects faulty addresses associated with faulty memory cells among the memory cells providing data errors. The fault detector includes; a first inverter that generates inverted read data by reading and inverting the read data, wherein the inverted read data is stored in the memory array, a first buffer that stores the read data and provides buffered data, an XOR operator that receives the buffered data from the first buffer, receives read-out inverted data generated by reading the inverted read data stored in the memory array, and performs an XOR operation on the buffered data and the read-out inverted read data to generate calculation data, fault address detection unit that identifies the faulty addresses in response to the calculation data and generates faulty address information, a second inverter that generates inverted read-out inverted read data by receiving and inverting the read-out inverted read data, and an error pattern change unit that converts an uncorrectable error (UE)-causing data into a correctable error (CE)-causing data.

According to an embodiment of the present disclosure, there is provided a method of correcting data errors in read data generated by reading original data stored in memory cells of a memory array provided by a memory module using a memory controller including an error correction code (ECC) engine and a fault detector. The method includes; using the fault detector to generate faulty address information associated with faulty memory cells among the memory cells of the memory array by storing the read data in a first buffer to generate buffered read data, inverting the read data using a first inverter to generate inverted read data, storing the inverted read data in the memory array, reading the inverted read data from the memory array to generate read-out inverted read data, performing an XOR operation on the buffered read data and the read-out inverted read data to generate calculation data, and generating the faulty address information in response to the calculation data, using the fault detector to convert uncorrectable error (UC)-causing data into correctable error (CE)-causing data by inverting the read-out inverted read data using a second inverter to generate inverted read-out inverted read data, and applying the inverted read-out inverted read data to an error pattern change unit, wherein the error pattern change unit converts the uncorrectable error (UC)-causing data obtained by subtracting the original data from the read data into correctable error (CE)-causing data obtained by subtracting the original data from the inverted read-out inverted read data.

According to an embodiment of the present disclosure, there is provided a memory controller controlling operation of a memory module. The memory controller includes; a memory interface that controls communication of data between the memory controller and a memory array provided by the memory module, a first buffer that stores read data generated by reading original data stored in the memory array and provides buffered read data, an error correction code (ECC) engine that corrects data errors in the read data retrieved from the memory array, and a fault detector that generates faulty address information identifying faulty addresses of faulty memory cells in the memory array producing the data errors. The fault detector includes; a first inverter that generates inverted read data by inverting the read data, wherein the inverted read data is stored in the memory array, an XOR operator that receives the buffered data from the first buffer, receives read-out inverted data generated by reading the inverted read data stored in the memory array, and performs an XOR operation on the buffered data and the read-out inverted read data to generate calculation data, and a fault address detection unit that identifies the faulty addresses in response to the calculation data and generates the faulty address information.

BRIEF DESCRIPTION OF THE DRAWINGS

The above and other embodiments and features of the present disclosure may be better understood upon consideration of the following detailed description together with the accompanying drawings, in which:

FIG. 4 is a block diagram illustrating an ECC engine according to embodiments of the present disclosure, wherein

DETAILED DESCRIPTION

Throughout the written description and drawings, like reference numbers and labels are used to denote like or similar elements, components, method steps and/or features.

Figure (FIG.) 1 is a block diagram of a memory device according to embodiments of the present disclosure.

Figure 1:
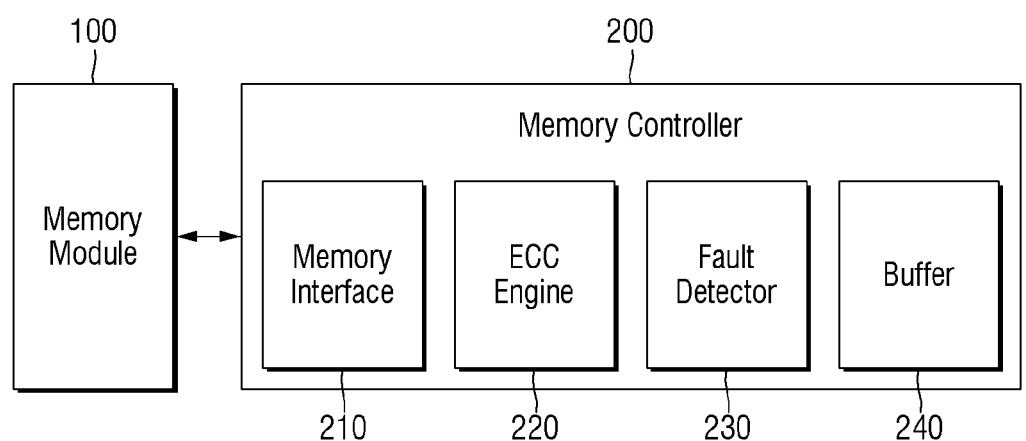
FIG. 1 is a block diagram of a memory device according to embodiments of the present disclosure.

Referring to FIG. 1, a memory device 10 generally includes a memory module 100 and a memory controller 200. Here, in some embodiments, the memory controller 200 may include a memory interface 210, an Error Correction Code (ECC) engine 220, a fault detector 230, and a buffer 240.

The memory module 100 may be, for example, a dual inline memory module (DIMM), but the present disclosure is not limited thereto. Alternately, the memory module 100 may be a single inline memory module (SIMM). For convenience of description, the memory module 100 may be referred hereafter as a DIMM without further specification of DIMM type. One example of the memory module 100 will be described hereafter in relation to FIG. 2.

Figure 2:
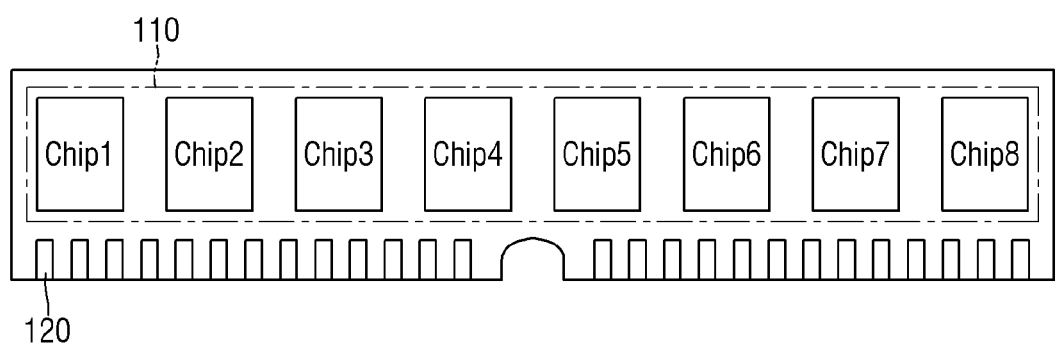
FIG. 2 is a block diagram of a memory module according to embodiments of the present disclosure.

FIG. 2 illustrates a memory module according to embodiments of the present disclosure.

Referring to FIG. 2, the memory module 100 includes a rank of memory chips 110 (e.g., first, second, third, fourth, fifth, sixth, seventh and eighth (hereafter collectively, "first through eighth" memory chips), as well as input/output (I/O) pins 120.

In some embodiments, the memory module 100 may be implemented as a thin rectangular card including the first through eighth memory chips (or alternately expressed, "Chip1 through Chip 8"). Here, the first through eighth memory chips may arranged in the single rank 110, but those skilled in the art will appreciate that embodiments of the present disclosure may include any reasonable number of memory chips arranged in one or more rank(s) and/or column(s). Further in this regard, the memory module 100 may include passive elements (e.g., resistors, inductors and/or capacitors), registers, buffers, hubs, one or more nonvolatile storage device(s) (e.g., NAND flash memories), as well as volatile storage devices (e.g., DRAMs, Static RAMs (SRAMS), etc.).

The I/O pins 120 may be used to transmit and/or receive (hereafter without further distinction, "communicate") data associated with the first through eighth memory chips. For example, the I/O pins 120 may be used to communicate "read data" retrieved from the first through eighth memory chips and to an external circuit. Alternately or additionally, the I/O pins 120 may be used to communicate "write data" to be written (or programmed) from an external circuit to the first through eighth memory chips.

Figure 3:
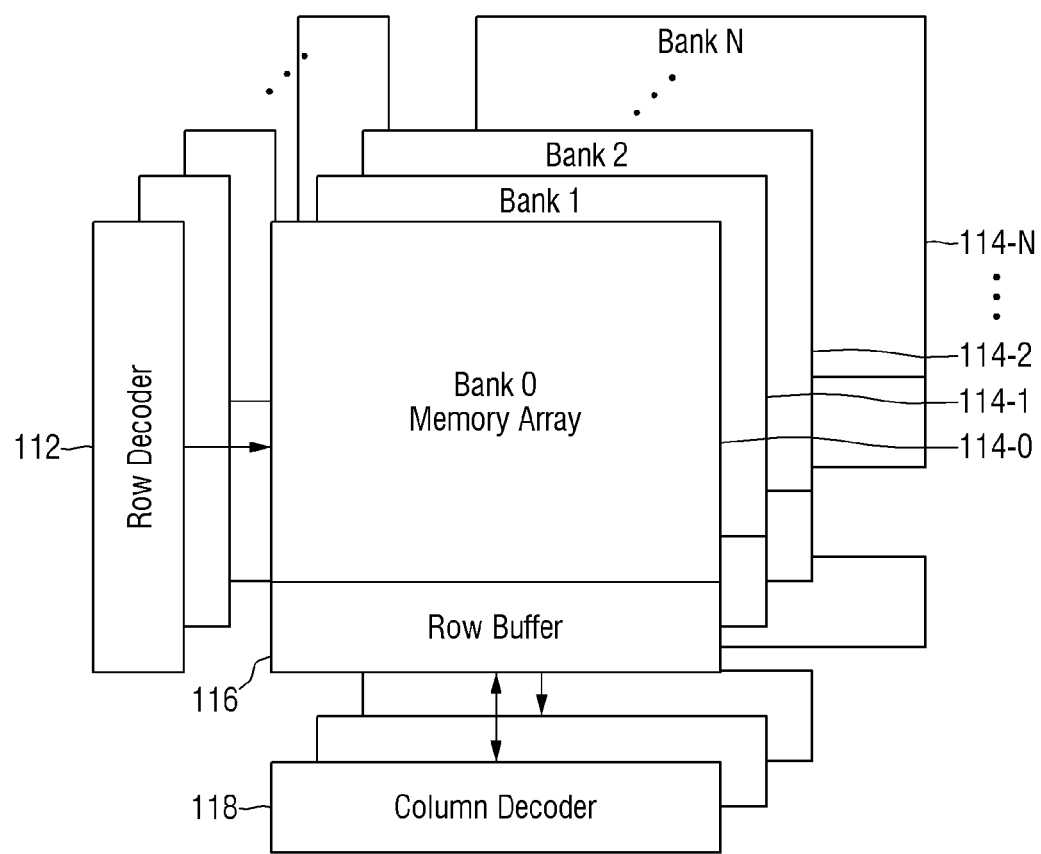
FIG. 3 is a block diagram of a memory chip according to embodiments of the present disclosure.

FIG. 3 is a block diagram further illustrating in one example a memory chip (e.g., a first memory chip, or Chip 1 of FIG. 2) according to embodiments of the present disclosure. Here, any one or more of Chip 2 through Chip 8 may be similarly configured and operated.

The first memory chip may include a plurality of banks (e.g., Bank0 through BankN-114-0 through 114-N, where 'N' is a natural number). Each of the banks Bank0 through BankN may include a row decoder 112, a row buffer 116, and a column decoder 118.

Each of the banks Bank0 through BankN may include a memory array including a plurality of memory cells, wherein each memory cell may be configured to store write data and/or provide read data. One or more of the banks Bank0 through BankN may include an error correction code (ECC) cell array. In some embodiments, the memory cells may be DRAM cells (e.g., synchronous DRAM (SDRAM) cells). In the description that follows, it is assumed that each one of the plurality of the memory cells is a DRAM cell.

The DRAM cells may be arranged in a matrix of rows and columns, wherein the row decoder 112 may be connected one or more rows of memory cells, and may be used to select a particular row of memory cells.

The column decoder 118 may be connected one or more columns of memory cells, and may be used to select a particular column of memory cells.

The row buffer 116 may be connected to one or more of the columns of memory cells. In some embodiments, the row buffer 116 may include a plurality of page buffers, wherein each page buffer may be variously configured to operate as a write driver (e.g., during a write operation) or a sense amplifier (e.g., during a read operation). In some embodiments, the row buffer 116 may apply a bitline voltage corresponding to write data to the memory array through corresponding bitline(s). Alternately, the row buffer 116 may sense a current or a voltage (hereafter, "voltage/current") on one or more bitline(s) in order to determine read data stored in the memory array.

Referring to FIGS. 1 and 3, the memory controller 200 may be configured to control operation of the memory device 10. For example, the memory controller 200 may receive and interpret command(s) provided by a host (not shown), and perform one or more operation(s) related to the memory device 10 in accordance with the resulting interpretation.

In some embodiments, the memory interface 210 may be compatible with various technical specifications such as those associated with Dual Data Rate version 3 (DDR3) and published by the Joint Electronic Device Engineering Council (JEDEC) on Jun. 27, 2007 (e.g., release 21), DDR version 4 (DDR4) published by JEDEC on September 2012, low power DDR version 3 (LPDDR3) (JESD209-3B) published by JEDEC on August 2013, low power DDR version 4 (LPDDR4) (JESD209-4) published by JEDEC on August 2014, Wide I/O 2 (WIO2) (JESD229-20 published by JEDEC on August 2014), High Bandwidth Memory (HBM) DRAM (JESD235) published by JEDEC on October 2013), as well as DDR version 5 (DDR5), low power DDR version 5 (LPDDR5), Wide I/O 3 (WIO3), and HBM version2 (HBM2)—all currently under discussion at JEDEC, as well as related derivatives and extensions of same.

In this regard, the buffer 240 of the memory controller 200 may be a register, a DRAM, an SDRAM, a SRAM, but embodiments of the present disclosure are not limited thereto.

The ECC engine 220 may perform one or more encoding operation(s) on write data to be stored in the memory arrays of the memory module 100. Some of these encoding operation(s) may include the generation of parity bits. The ECC engine 220 may further perform one or more error correction operation(s) on read data retrieved from the memory arrays of the memory module 100. Some of these error correction operation(s) may include the use of parity bits.

Further in this regard, the ECC engine 220, together with the fault detector 230, may perform an error correction operation on data retrieved (or read) from the memory arrays of the memory module 100. In some embodiments, the ECC engine 220 may perform an error correction operation on read data in response to (or based on) an identification of a "faulty memory chip" (e.g., a memory chip including "faulty memory cells" providing errant read data) and/or an identification of a "faulty address" (e.g., an address associated with the faulty memory cells). For example, once a memory chip among the plurality of memory chips (e.g., Chip 1 through Chip 8 of FIG. 1) is deemed to have provided read data including one or more data errors (hereafter referred to "data errors" regardless of specific number of errors), it may be identified as a faulty memory chip including faulty memory cells for purposes of further data processing operations, and once an address associated with faulty memory cells among the plurality of memory cells is deemed to be associated with read data including data errors, it may be identified as a faulty address for purposes of further data processing operations. In some embodiments, data errors (or "faults") may be detected and/or identified by the fault detector 230 (e.g., data exhibiting a changed pattern (or a "faulty pattern") may be detected and identified by the fault detector 230).

Operation of the ECC engine 220, at least in some embodiments, will be described hereafter in relation to FIGS. 4, 5 and 6.

Figure 4:
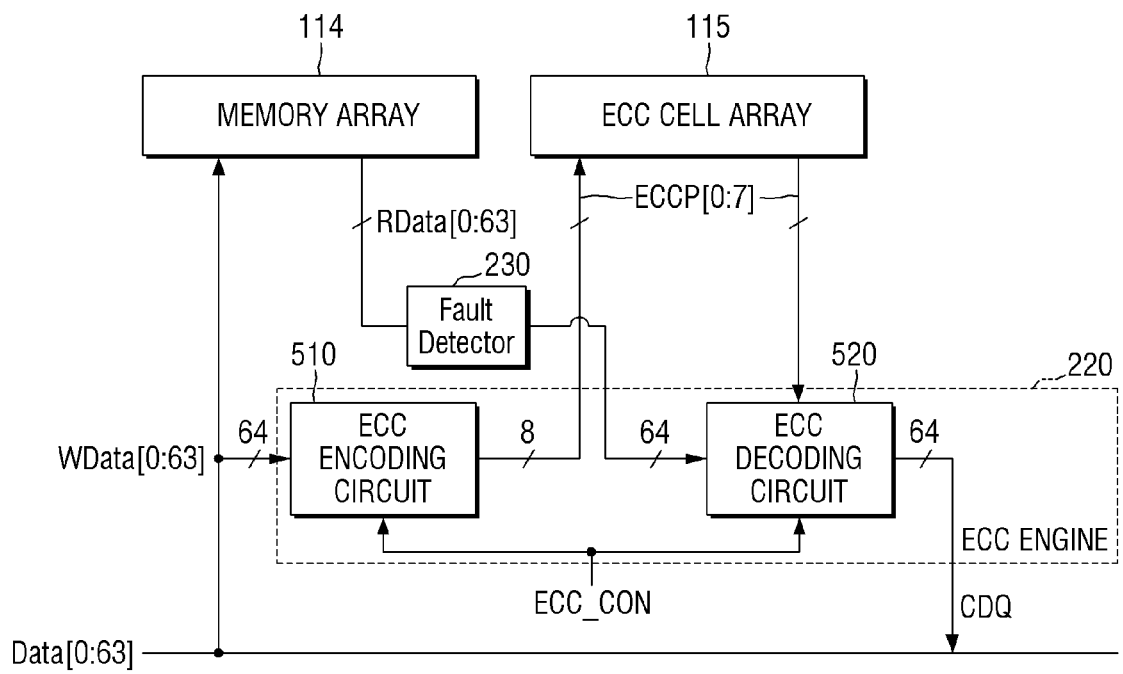

FIG. 4 is a block diagram further illustrating operation of the ECC engine 220 according to embodiments of the present disclosure.

Referring to FIGS. 1, 3 and 4, the ECC engine 220 may include an ECC encoding circuit 510 and an ECC decoding circuit 520. The ECC encoding circuit 510 may generate parity bits ECCP[0:7] for write data WData[0:63] to be written to memory cells of a memory array 114 in response to an ECC control signal ECC_CON. Here, the number(s) of bits associated with exemplary read/write data and/or exemplary parity bits may vary by design, and embodiments of the present disclosure are not limited to the particularly described examples.

The parity bits ECCP[0:7] may be stored in an ECC cell array 115. Further of note in this regard, the ECC encoding circuit 510 may generate the parity bits ECCP[0:7] for the write data WData[0:63] to be written to memory cells of the memory array 114—which may include faulty memory cells.

The ECC decoding circuit 520 may correct data errors detected in read data RData[0:63] retrieved from memory cells of the memory array 114 using the parity bits ECCP[0:7] retrieved from the ECC cell array 115 in response to the ECC control signal ECC_CON in order to output corrected read data Data[0:63]. That is, the ECC decoding circuit 520 may correct such data errors using the read data RData[0:63] retrieved from the memory cells of the memory array 114, even if the memory cells include faulty memory cells, by also using the parity bits ECCP[0:7] retrieved from the ECC cell array 115 in response to the ECC control signal ECC_CON. In this manner, corrected read data Data[0:63] may be obtained.

In some embodiments, the fault detector 230 may be disposed between the memory array 114 and the ECC decoding circuit 520. The ECC decoding circuit 520 may be configured to perform an error correction operation on read data retrieved from the memory array 114 in response to faulty address(es) associated with faulty memory cell(s), as detected by the fault detector 230 (e.g., by detecting faulty (or changed) data patterns).

Figure 5:
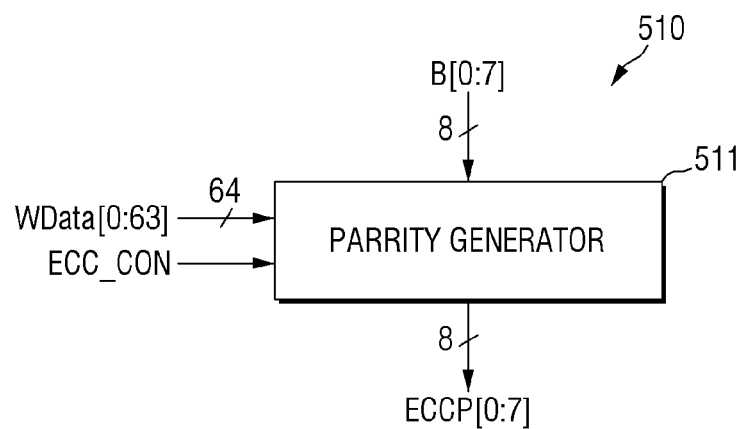
FIG. 5 is a block diagram further illustrating the ECC encoding circuit 510 of FIG. 4.
Figure 6:
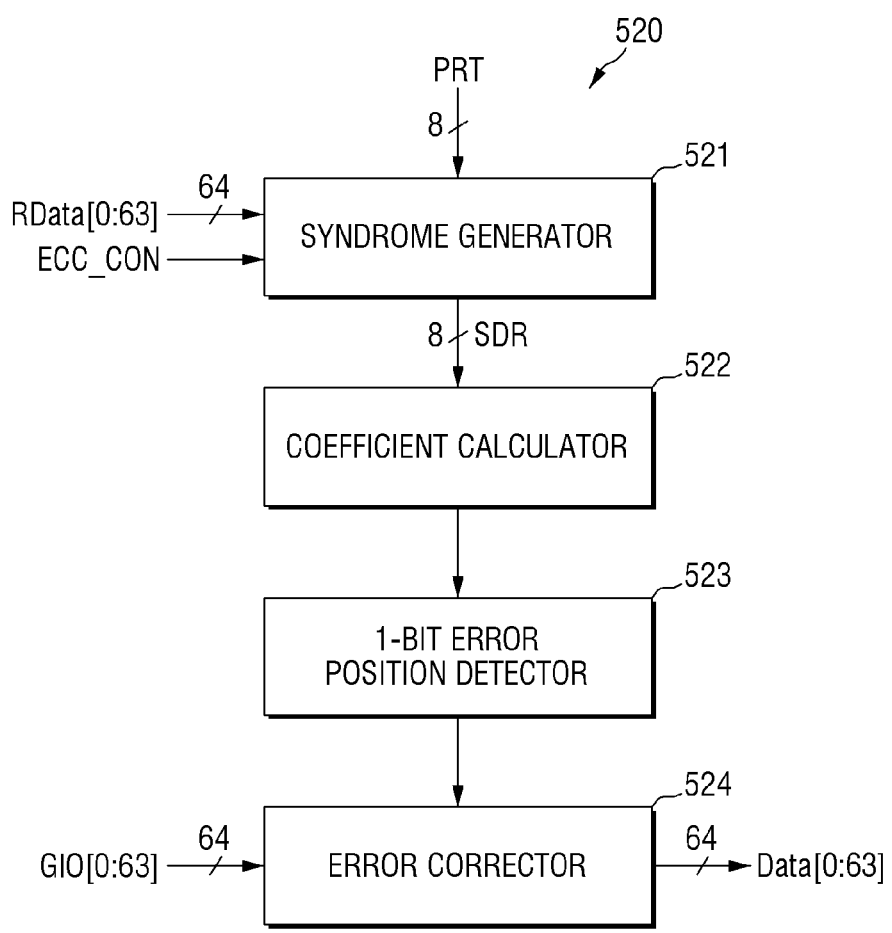
FIG. 6 is a block diagram further illustrating the ECC decoding circuit 520 of FIG. 4.

One example of the ECC encoding circuit 510 is described in relation to FIG. 5 and one example of the ECC decoding circuit 520 is described in relation to FIG. 6.

FIG. 5 is a block diagram further illustrating the ECC encoding circuit 510 of FIG. 4.

Referring to FIG. 5, the ECC encoding circuit 510 may include a parity generator 511 receiving 64-bit write data WData[0:63] as well as basis bits B[0:7] in response to the ECC control signal ECC_CON, and generating parity bits ECCP[0:7] by performing an XOR array operation. That is, the basis bits B[0:7] may be bits used to generate parity bits ECCP[0:7] associated with the 64-bit write data WData[0:63] and may, in one example, include b'00000000. However, other particular bits may be used as the basis bits B[0:7].

FIG. 6 is a block diagram further illustrating the ECC decoding circuit 520 of FIG. 4.

Referring to FIG. 6, the ECC decoding circuit 520 may include a syndrome generator 521, a coefficient calculator 522, a 1-bit error position detector 523, and an error corrector 524. The syndrome generator 521 may receive the 64-bit read data RData[0:63] and the 8 parity bits ECCP[0:7] in response to the ECC control signal ECC_CON, and may generate syndrome data S[0:7] using an XOR array operation. The coefficient calculator 522 may calculate a coefficient of an error position equation using the syndrome data S[0:7]. The error position equation may be an equation having the reciprocal of an error bit as its root. The 1-bit error position detector 523 may calculate the position of 1-bit error using the error position equation. The error corrector 524 may determine the location of the 1-bit error based on the result of the detection performed by the 1-bit error position detector 523. The error corrector 524 may correct data errors by inverting the values of bits of faulty memory cells (i.e., memory cells producing data errors)

among the memory cells storing the 64-bit read data RData [0:63] based on the location of the 1-bit error in order to generate corrected 64-bit data Data[0:63].

Hereinafter, a description will be provided that further explains an approach wherein faulty memory cell(s) in the memory array 114 are identified by the fault detector 230 (e.g., using a faulty data pattern), faulty address(es) associated with the faulty memory cell(s) are further identified, and the faulty address(es) are then be variously communicated. As a result of this approach, the ECC decoding circuit 520 may effectively correct data errors in read data.

Figure 7:
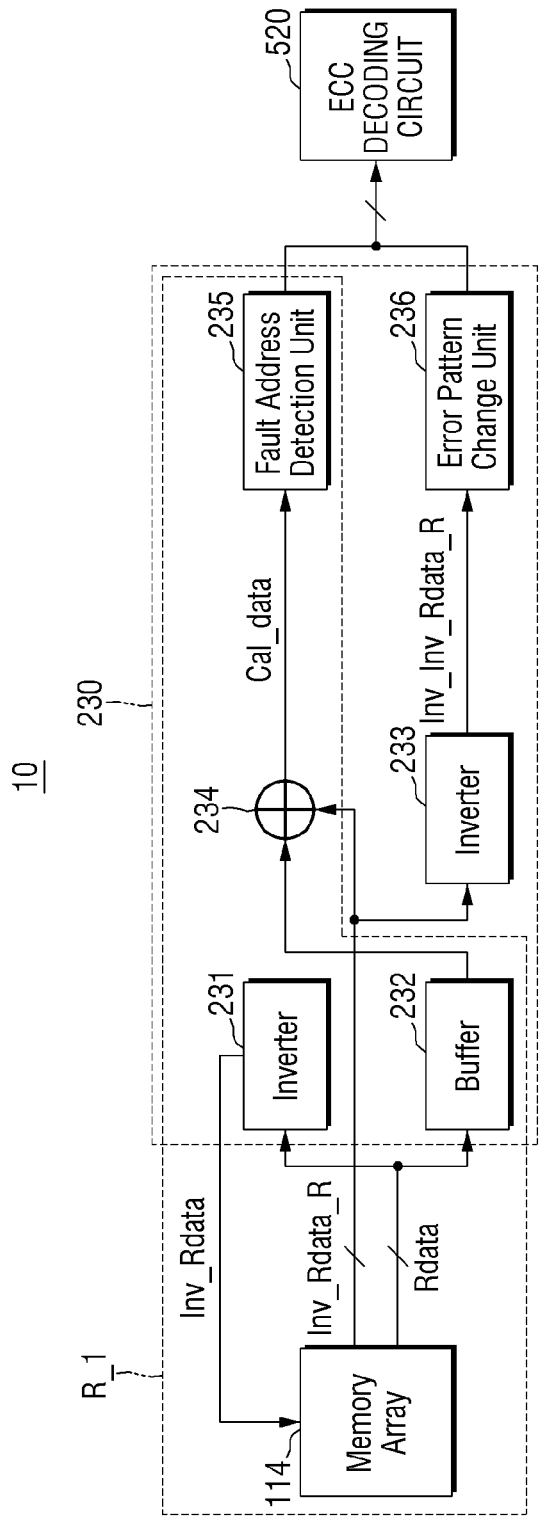
FIG. 7 is a block diagram illustrating a fault detector 230 according to embodiments of the present disclosure.

FIG. 7 is a block diagram further illustrating in one example the fault detector 230 of the memory device 10 according to embodiments of the present disclosure.

Referring to FIG. 7, the fault detector 230 may include a first inverter 231, a buffer 232, a second inverter 233, an XOR operator 234, a fault address detection unit 235, and an error pattern change unit 236.

In some embodiments, the first and second inverters 231 and 233 may be inverters configured to invert input data on a bit-by-bit basis.

In this regard, for example, the first inverter 231 may generate inverted read data (Inv_Rdata) by inverting read data (Rdata) retrieved from the memory array 114. The inverted read data (Inv_Rdata) may then be written back to the memory array 114. The second inverter 233 may then receive, and invert the inverted read data read-out from the memory array 114 (Inv_Rdata_R) to thereby generate inverted read-out inverted read data (Inv_Inv_Rdata_R). Then, the inverted read-out inverted read data (Inv_Inv_Rdata_R) may be communicated to the error pattern change unit 236.

The buffer 232 may be a register, a DRAM, an SDRAM, an SRAM or similar circuit appropriately configured to temporarily store the read data (Rdata) and provide buffered read data.

The XOR operator 234 may receive buffered read data from the buffer 232 as well as the inverted read data read-out from the memory array 114 (Inv_Rdata_R). The XOR operator 234 may then perform an XOR operation between the buffered read data and the inverted read data read-out from the memory array 114 (Inv_Rdata_R) to generate calculation data (Cal_data). That is, the XOR operator 234 may be used to generate calculation data (Cal_data) by performing an XOR operation on the inverted read data read-out from the memory array 11 (Inv_Rdata_R) and the buffered read data provided by the buffer 232. The calculation data (Cal_data) may then be communicated to the fault address detection unit 235.

The fault address detection unit 235 may identify faulty address(es) associated with faulty memory cell(s) producing data errors in relation to the calculation data (Cal_data). For example, in some embodiments, the fault address detection unit 235 may detect faulty address(es) associated with bits of the calculation data (Cal_data) having a '0' value.

The error pattern change unit 236 receives the inverted read-out inverted read data (Inv_Inv_Rdata_R) provided by the second inverter 233, and may be used to change (or correct) an error pattern associated with the read data (Rdata). For example, if an error pattern of the read data (Rdata) is an uncorrectable error (UE)-causing data (Gen_UE), the error pattern change unit 236 may change the error pattern of the read data (Rdata) into a correctable error (CE)-causing data (Gen_CE).

Thus, the fault detector 230 may communicate faulty address information and/or the CE-causing data (Gen_CE) of the read data (Rdata) to the ECC decoding circuit 520.

Then, the ECC decoding circuit 520 may perform ECC decoding in response to the faulty address information and/or the CE-causing data (Gen_CE) of the read data (Rdata) received from the fault detector 230.

It this regard, the following description further explains in one example how the fault detector 230 may detect faulty address(es) in relation to a first route R_1 of the memory device 10. That is, FIG. 8 is a conceptual diagram further illustrating operation of the fault detector 230 in accordance with the first route R_1.

Figure 8:
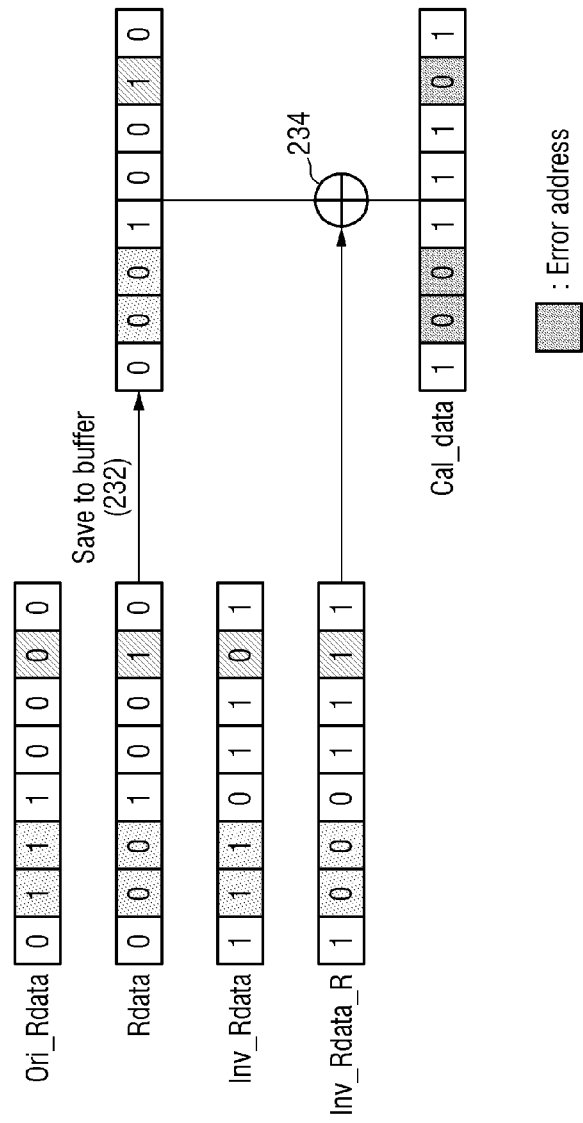
FIG. 8 is a conceptual diagram further illustrating operation of the fault detector 230 of FIG. 7 in relation to first route R_1.

Referring to FIGS. 7 and 8, it is assumed as a working example, that original data (Ori_data) stored in the memory array 114 has a value of 01110000.

Due to permanent faults in the memory array 114, read data (Rdata) obtained in relation to the stored original data (Ori_data) may be different from the original data (Ori_data) as the result of executing a read operation directed to the original data (Ori_data) as stored in the memory array 114.

For example, it is assumed that due to permanent faults in the memory array 114, the second bit of the original data (Ori_data) is unconditionally read as '1' (i.e., the second bit is an example of a "Stuck at 1 Fault"). It is further assumed that due to permanent faults in the memory array 114, the sixth and seventh bits of the original data (Ori_data) are unconditionally read as '0' (i.e., the sixth and seventh bits are each an example of a "Stuck at 0 Fault"). Accordingly, the read data (Rdata) retrieved as the result of the executed read operation has an errant value of 00010010, instead of value 01110000 associated with the original data (Ori_data). Nonetheless, the read data Rdata is temporarily stored in the buffer 232.

The first inverter 231 may generate the inverted read data (Inv_Rdata) by inverting the read data (Rdata) on a bit-by-bit basis. Thereafter, the inverted read data (Inv_Rdata) having a value of 11101101 may be stored in the memory array 114.

The fault detector 230 may then retrieve the inverted read data (Inv_Rdata) from the memory array 114 to generate read-out inverted read data (Inv_Rdata_R). Here, due to the permanent faults in the memory array 114, the read-out inverted read data (Inv_Rdata_R) will have a value of 10001111.

The XOR operator 234 may then perform an XOR operation on the read-out inverted read data (Inv_Rdata_R) and the buffered data provided by the buffer 232 in order to generate the calculation data (Cal_data) having a value of 10011101. Thereafter, the calculation data (Cal_data) may be communicated to the fault address detection unit 235.

The fault address detection unit 235 may then identify particular bits (or faulty address(es)) associated with data errors in relation to the calculation data (Cal_data). For example, in some embodiments, bits of the calculation data (Cal_data) having a '0' value may be used to identify faulty address(es) associated with faulty memory cell(s).

So, continuing with the illustrated example of FIG. 8, the fault address detection unit 235 may generate a detection result indicating that data errors have occurred in the second, sixth, and seventh bits of the calculation data (Cal_data)— each of which has a '0' value. The fault address detection unit 235 may then communicate corresponding faulty address information to the ECC decoding circuit 520 identifying the second, sixth, and seventh bits of the memory array 114 as being permanently associated with providing permanent faults. Thereafter, the ECC decoding unit 520 may perform variously ECC decoding in response to the faulty address information provided by the fault address detection unit 235.

The converting of an uncorrectable error (UE)-causing data (Gen_UE) into CE-causing data (Gen_CE) and the communication of the resulting CE-causing data (Gen_CE) to the ECC decoding circuit 520 via a second route R_2 of the memory device 10 will now be described in relation to FIGS. 9 and 10.

FIG. 9 is a block diagram again illustrating the fault detector 230 of the memory device 10 according to embodiments of the present disclosure. However, FIG. 10 is a conceptual diagram further illustrating operation of the fault detector 230 of FIG. 9 in accordance with the second route R_2. In this regard, the same fault detector 230 is illustrated in relation to FIGS. 7 and 9, however a distinction is drawn between the first route R_1 and the second route R_2.

Figure 9:
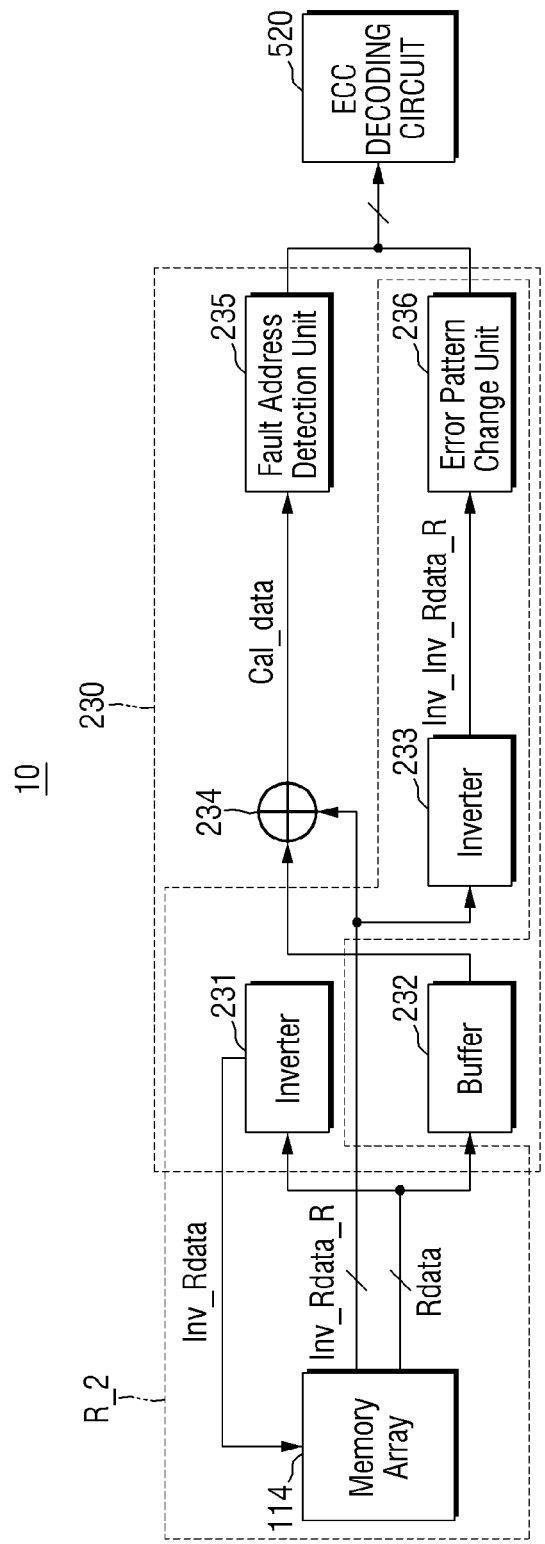
FIG. 9 is another block diagram illustrating the fault detector 230 according to embodiments of the present disclosure.
Figure 10:
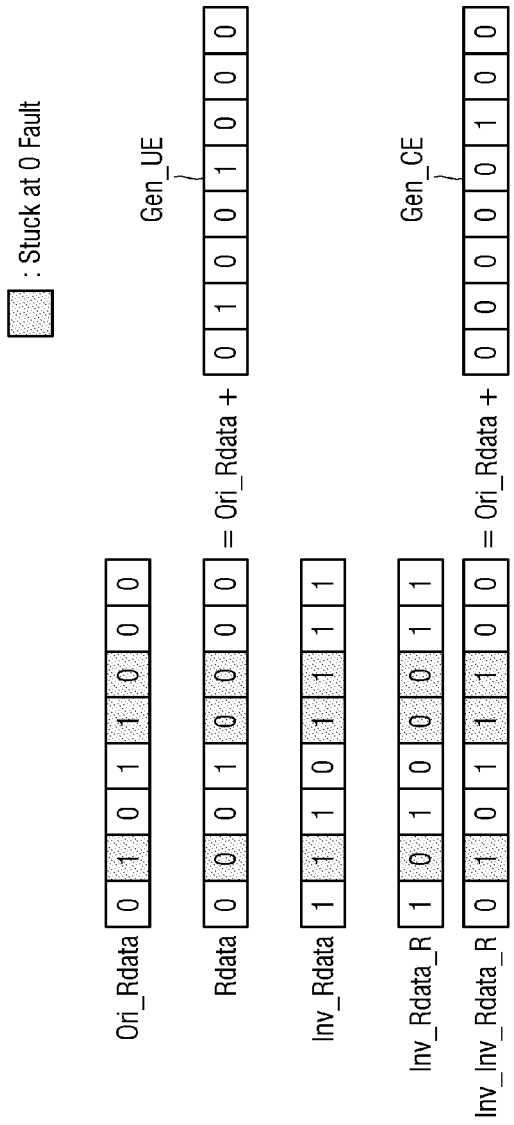
FIG. 10 is a conceptual diagram further illustrating operation of the fault detector 230 of FIG. 9 in relation to a second route R_2.

Referring to FIGS. 9 and 10, it is assumed that original data (Ori_data) is stored in the memory array 114 and has a value of 01011000.

Due to permanent faults in the memory array 114, the read data (Rdata) obtained by reading (e.g., executing a read operation directed to) the original data (Ori_data) from the memory array 114 may have a different value than the original data (Ori_data).

For example, it is assumed that due to permanent faults in the memory array 114, the second, third, and seventh bits of the original data (Ori_data) are unconditionally read as 0 (i.e., each of the second, third and seventh bits is an example of a "Stuck at 0 Fault"). Accordingly, the read data (Rdata) obtained by retrieving the original data (Ori_data) from the memory array 114 has a value of 00010000.

Here, the UE-causing data (Gen_UE) may have a value obtained by subtracting the original data (Ori_data) from the read data (Rdata) (e.g., a value of 01001000).

The first inverter 231 may generate the inverted read data (Inv_Rdata) by inverting the read data (Rdata) on a bit-by-bit basis (e.g., a value of 11101111). The inverted read data (Inv_Rdata) may then be stored in the memory array 114.

The fault detector 230 may then retrieve the inverted read data (Inv_Rdata) from the memory array 114. However, due to permanent faults in the memory array 114, the resulting read-out inverted read data (Inv_Rdata_R) obtained by reading the inverted read data (Inv_Rdata) from the memory array 114 has a value of 10100011.

The second inverter 233 may then generate inverted read-out inverted read data (Inv_Inv_Rdata_R) by inverting the read-out inverted read data (Inv_Rdata_R) on a bit-by-bit basis. That is, the inverted read-out inverted read data (Inv_Inv_Rdata_R) may have a value of 01011100.

The error pattern change unit 236 may generate CE-causing data (Gen_CE) in response to the inverted read-out inverted read data (Inv_Inv_Rdata_R). For example, the error pattern change unit 236 may generate the CE-causing data (Gen_CE) by subtracting the value of the original data (Ori_data) from the value of the inverted read-out inverted read data (Inv_Inv_Rdata_R). That is, the error pattern change unit 236 may convert the UE-causing data (Gen_UE) into the CE-causing data (Gen_CE), and communicate the resulting CE-causing data (Gen_CE) to the ECC decoding circuit 520. Thereafter, the ECC decoding circuit 520 may perform ECC decoding in response to the CE-causing data (Gen_CE).

Figure 11:
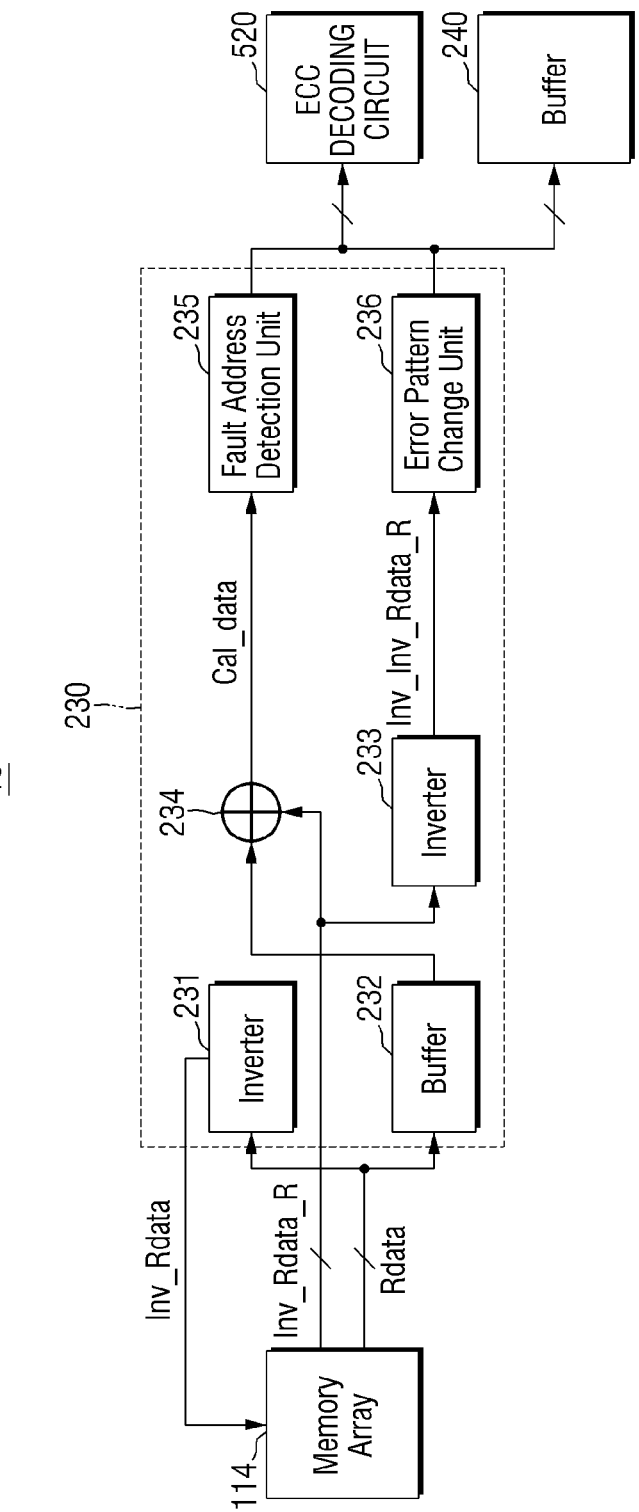
FIGS. 11 and 12 are additional, respective block diagrams illustrating memory devices 10 and 11 according to embodiments of the present disclosure.
Figure 12:
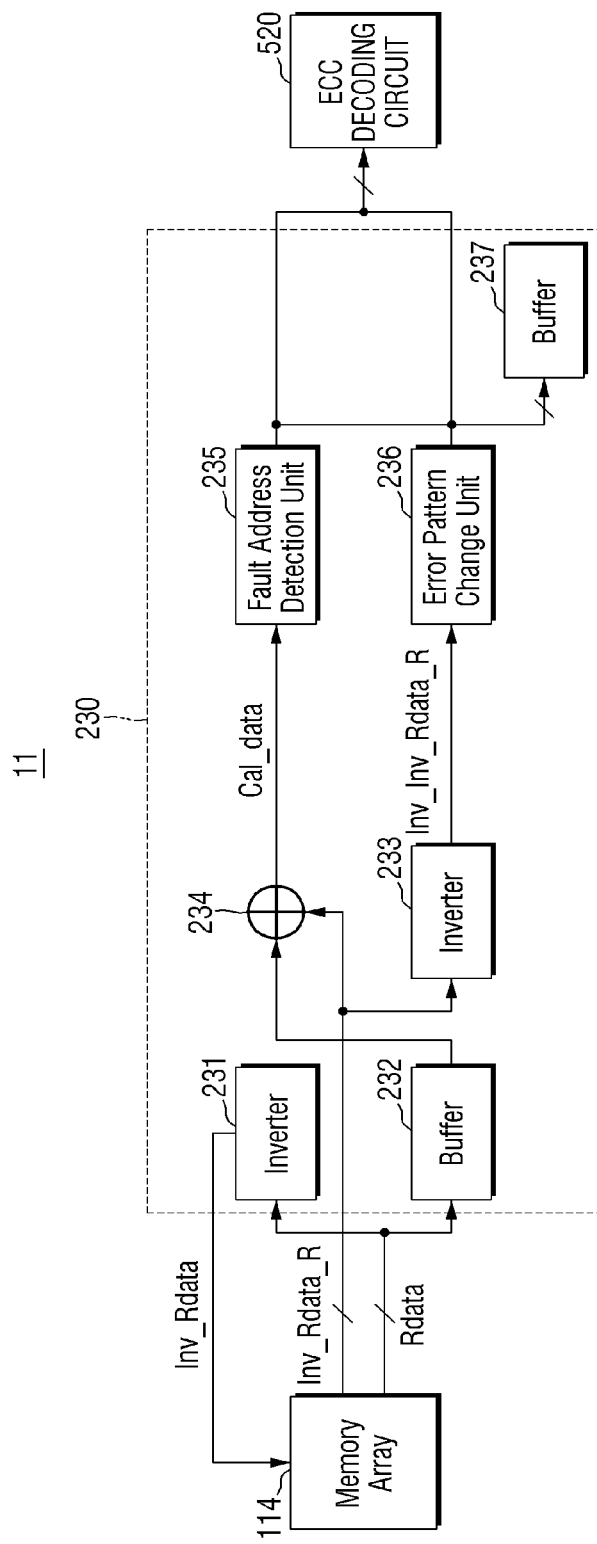

FIGS. 11 and 12 are respective block diagrams illustrating various memory devices according to embodiments of the present disclosure.

Referring to FIG. 11, the memory device 10 may store permanent fault address information and/or CE-causing data (Gen_CE) in the buffer 240, as shown in FIG. 1.

Alternately, referring to FIG. 12, a memory device 11 may include a fault detector 230 further including a buffer 237. Her, the permanent fault address information obtained by a fault address detection unit 235 and/or the CE-causing data (Gen_CE) obtained by an error pattern change unit 236 may be temporarily stored in the buffer 237 of the fault detector 230.

In this regard, the buffer 237 may be a register, a DRAM, an SDRAM, or an SRAM, but the present disclosure is not limited thereto.

Figure 13:
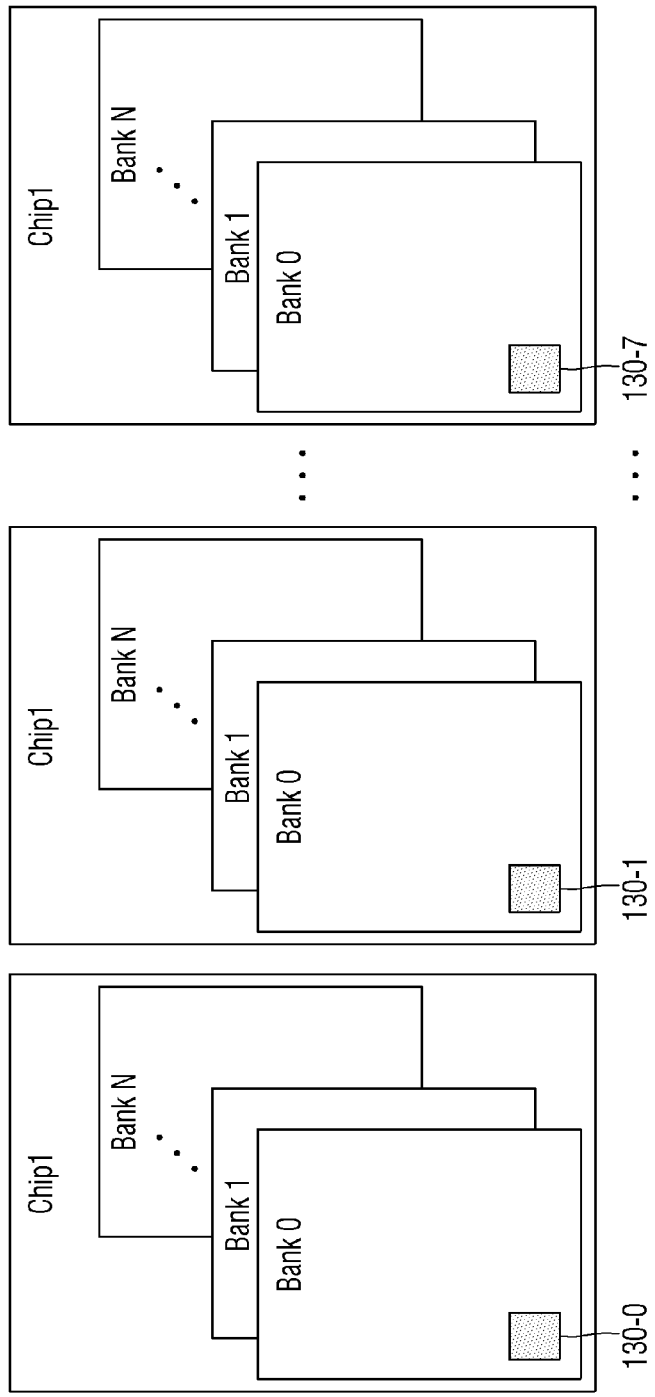
FIG. 13 is a block diagram illustrating memory cells at identical locations in different chips according to embodiments of the present disclosure.

FIG. 13 is a conceptual diagram illustrating memory cells at identical locations in different chips according to embodiments of the present disclosure.

Referring to FIG. 13 and extending the example of FIG. 2, there may exist data 130-0, 130-1, 130-2, 130-3, 130-4, 130-5, 130-6 and 130-7 respectively stored at identical locations among identical banks included in the plurality of first through eighth memory chips (e.g., Chip1 through Chip 8).

Here, it is assumed that permanent fault address information identifies memory cell(s) storing data 130-0 in the first memory chip (Chip1). Accordingly, a memory device according to embodiments of the present disclosure may determine and identify permanent faults associated with the same address (or location) in the other memory chips (e.g., the second through eighth memory chips, Chip 2 through Chip 8) in response to (or based on) the permanent fault address information associated with data 130-0.

In this manner, memory devices according to embodiments of the present disclosure may use permanent fault address information derived in relation to any one of a plurality of memory chips (e.g., the first through eighth memory chips of FIG. 2) to determine faulty address(es) for the other memory chips among the plurality of memory chips at which permanent faults may be expected to occur.

Figure 14:
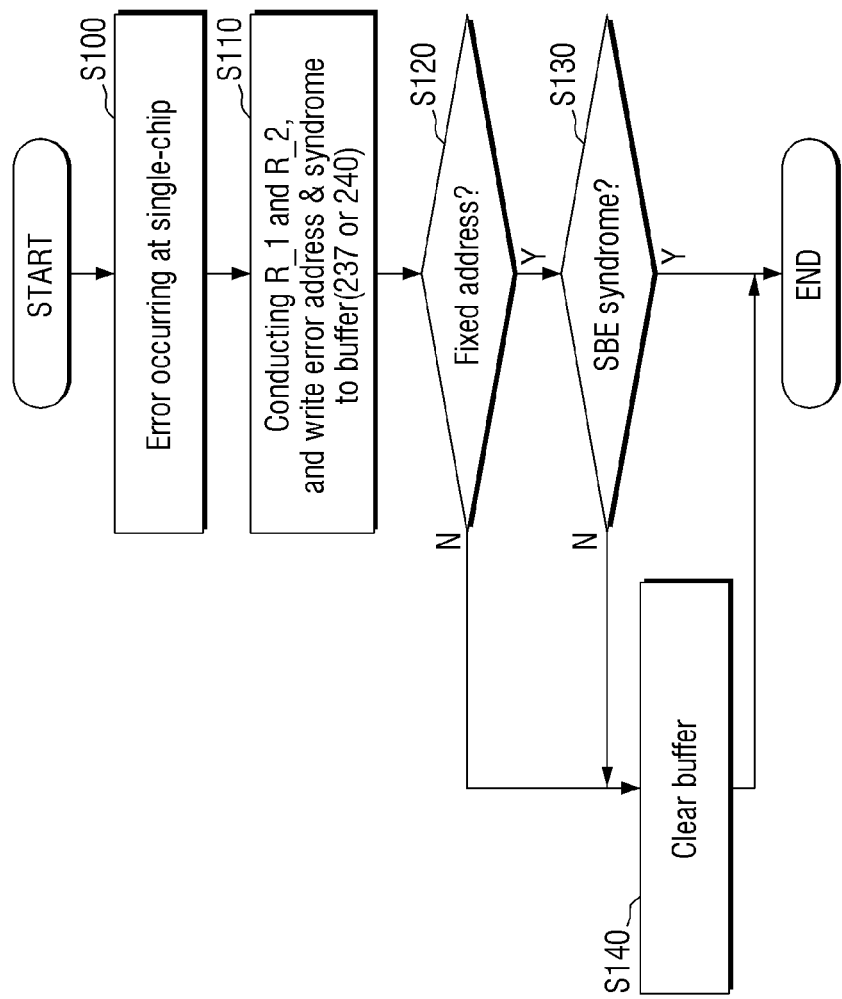
FIGS. 14 and 15 are respective flowcharts illustrating operation of memory device(s) according to embodiments of the present disclosure.
Figure 15:
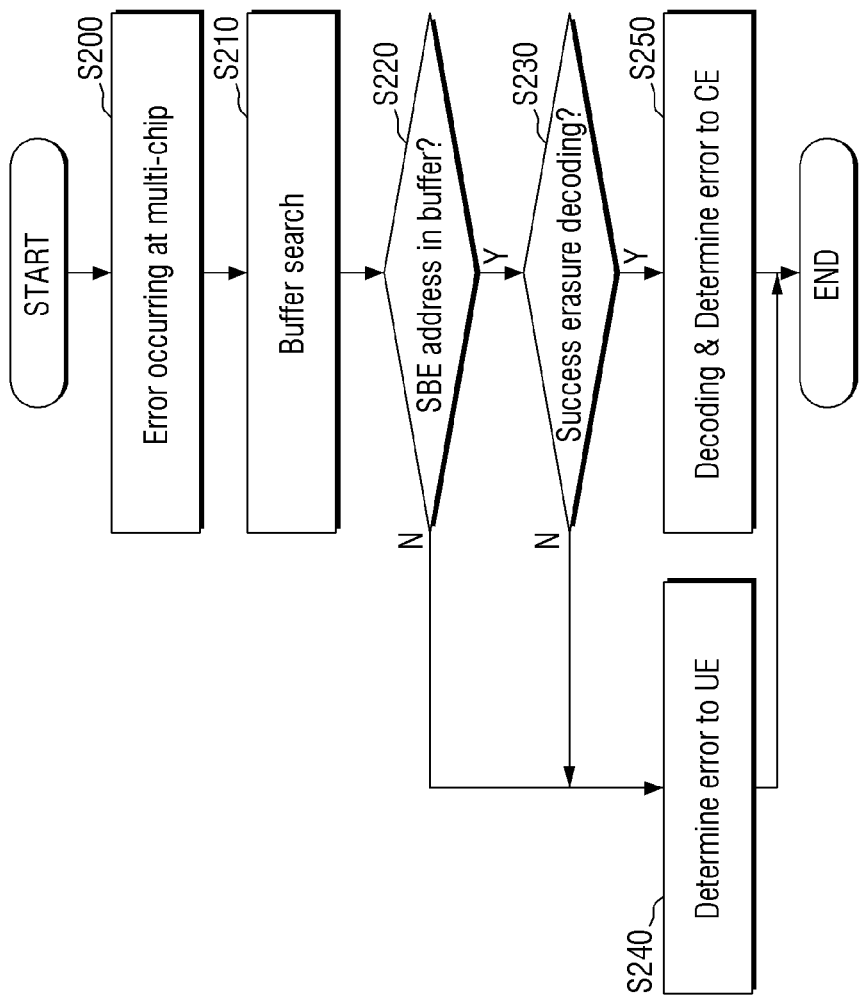

FIGS. 14 and 15 are respective flowcharts further illustrating operation of a memory device according to embodiments of the present disclosure.

Referring to FIGS. 1, 7, 9, 11, 12, and 14, it is assumed that data errors have occurred in a single memory chip (S100).

Then, at least one of permanent fault address information and CE-causing data (Gen_CE) respectively obtained via the first and second paths R_1 and R_2 by the fault address detection unit 235 and the error pattern change unit 236 may be stored in the buffer 237 or the buffer 240. For example, the CE-causing data (Gen_CE) may be stored in the buffer 240 as a syndrome by the ECC decoding circuit 520 (S110).

Thereafter, the memory controller 200 may determine whether the permanent fault address information stored in the buffer 237 or the buffer 240 is fixed (S120). For example, if the permanent fault address information stored in the buffer 237 or the buffer 240 has not been changed more than a predetermined number of times (e.g., a positive integer value set by a user), the memory controller 200 may determine that the permanent fault address information stored in the buffer 237 or the buffer 240 is "fixed."

If a determination is made that the permanent fault address information stored in the buffer 237 or the buffer 240 is not fixed (S120=N), the memory controller 200 may determine that the permanent fault address information stored in the buffer 237 or the buffer 240 is not valid and may clear (or delete) the permanent fault address information stored in the buffer 237 or the buffer 240 (S140). Thereafter, the memory controller 200 may also provide notification to the user. Alternately, if a determination is made that the permanent fault address information stored in the buffer 237 or the buffer 240 is fixed (S120=Y), the memory controller 200 may determine whether the syndrome stored in the buffer 240 constitutes a single bit error (SBE) (S130).

If a determination is made that the syndrome stored in the buffer 240 is not a SBE (S130=N), the memory controller 200 may clear the syndrome stored in the buffer 240 (S140). The memory controller 200 may also provide notification to the user. Alternately, if a determination is made that the syndrome stored in the buffer 240 is a SBE (S130=Y), the memory controller 200 may retain the information stored in the buffer 237 or the buffer 240.

Referring now to FIGS. 1, 7, 9, 11, 12, and 15, it is assumed that data errors have occurred in multiple memory chips (S200).

The memory controller 200 may then search a history of error-related information stored in the buffer 237 or the buffer 240 (e.g., permanent fault address information and/or CE-causing data Gen_CE (S210).

Thereafter, the memory controller 200 determines whether there exists an SBE address based on the error-related information (S220).

If a determination is made that no SBE address exists (S220=N), the memory controller 200 determines that the data errors are an UE (S240). Alternately, if a determination is made that there exists SBE address (S220=Y), the memory controller 200 determines whether erasure decoding has been successfully performed by the ECC decoding circuit 520 (S230).

If a determination is made that erasure decoding has not been successfully performed by the ECC decoding circuit 520 (S230=N), the memory controller 200 determines that the data error are an UE (S240). Alternately, if a determination is made that erasure decoding has been successfully performed by the ECC decoding circuit 520 (S230=Y), the memory controller 200 determines that the data errors are CE and may perform decoding using the ECC decoding circuit 520 (S250).

Figure 16:
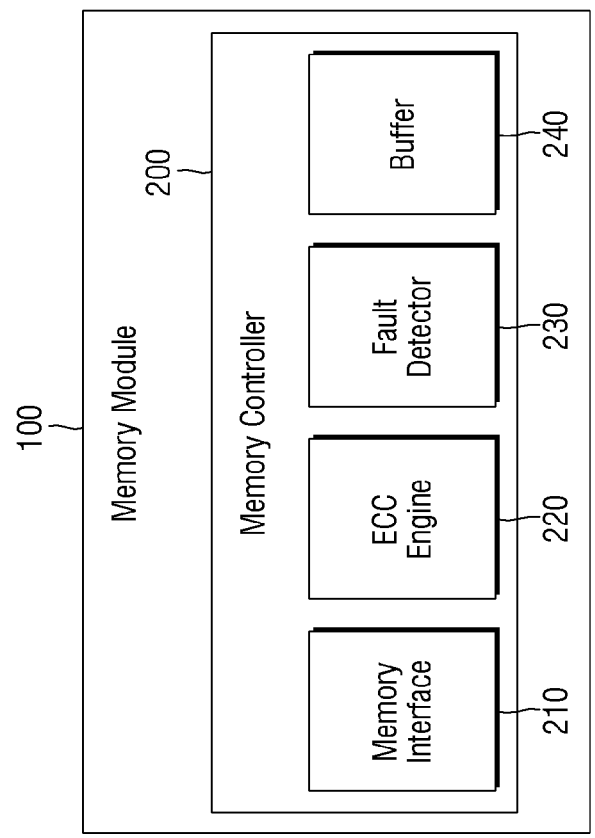
FIGS. 16 and 17 are respective block diagrams of memory modules according to embodiments of the present disclosure.
Figure 17:
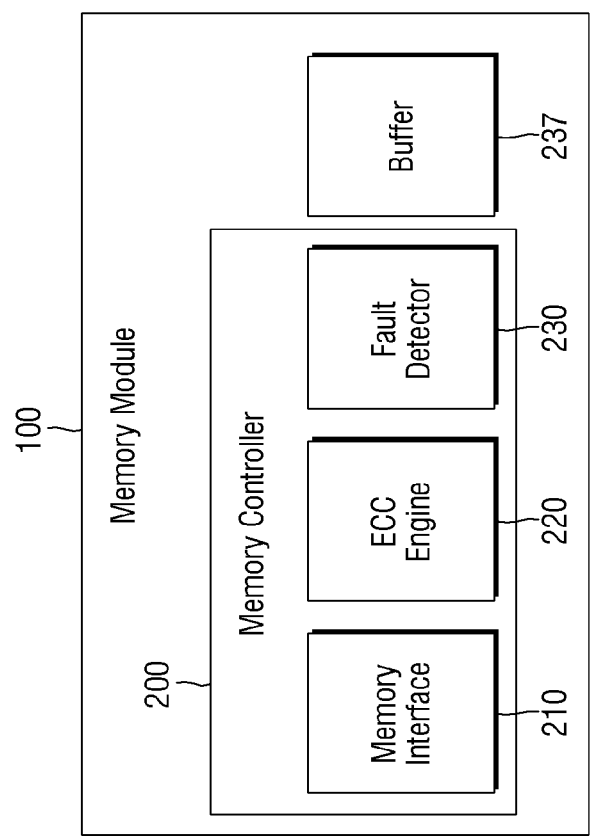

FIGS. 16 and 17 are respective block diagrams illustrating memory modules according to embodiments of the present disclosure.

Referring to FIG. 16, the memory controller 200 may be "mounted" (e.g., mechanically assembled and/or electrically connected) on the memory module 100. However, referring to FIG. 17, the buffer 237 may be disposed external to the memory controller 200.

Figure 18:
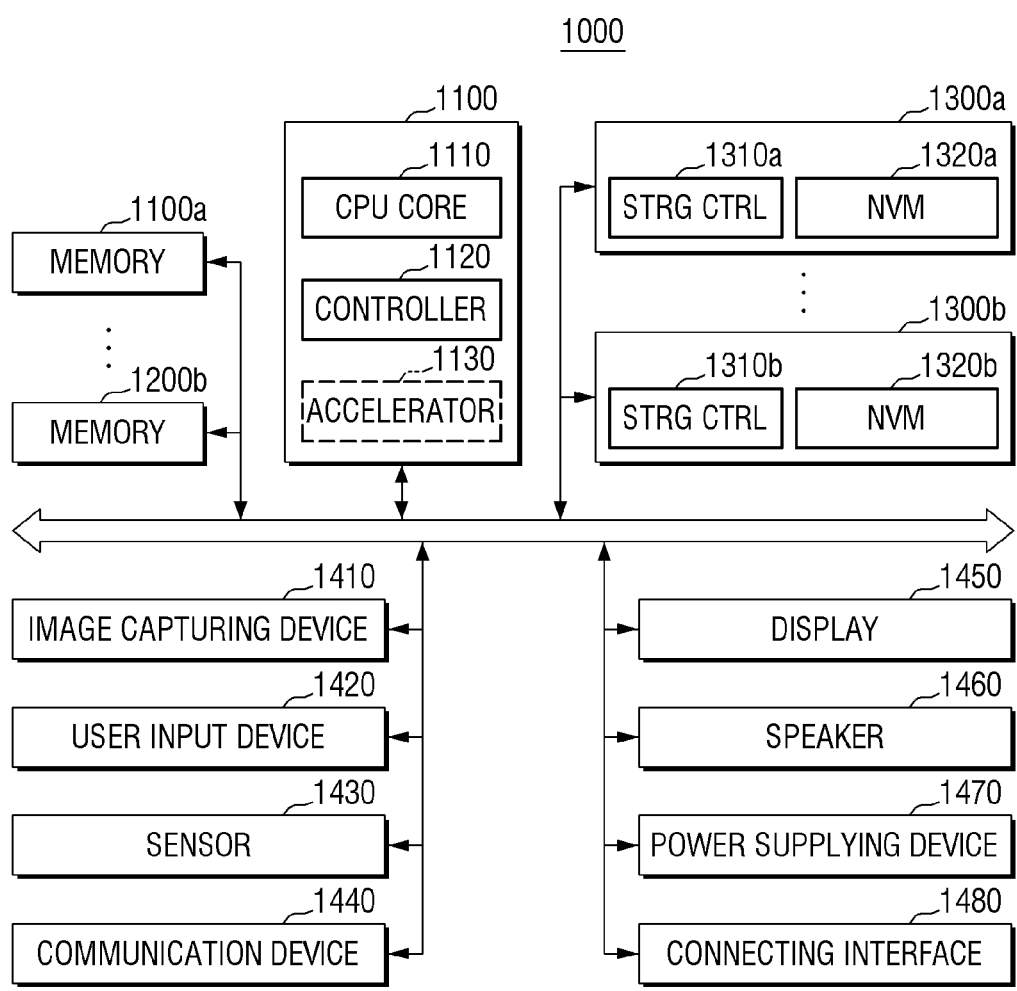
FIG. 18 is a block diagram illustrating a memory system including one or more memory device(s) according to embodiments of the present disclosure.

FIG. 18 is a block diagram of a memory system including one or more memory device(s) according to embodiments of the present disclosure.

Referring to FIG. 18, a memory system 1000 may be a mobile system such as a mobile phone, a smartphone, a tablet personal computer (PC), a wearable device, a healthcare device, or an Internet-of-Things (IoT) device, but the present disclosure is not limited thereto. Alternatively, the memory system 1000 may be a PC, a laptop computer, a server, a media player, or an automotive device such as a navigation device.

Referring to FIG. 18, the memory system 1000 may include a main processor 1100, memory modules 1200a and 1200b, and storage devices 1300a and 1300b and may further include at least one of an image capturing device 1410, a user input device 1420, a sensor 1430, a communication device 1440, a display 1450, a speaker 1460, a power supply device 1470, and a connecting interface 1480.

The main processor 1100 may control the general operation of the memory system 1000, particularly, the operations of the other elements of the memory system 1000. The main processor 1100 may be implemented as a general-purpose processor, a dedicated processor, or an application processor.

The main processor 1100 may include one or more CPU cores 1110 and may further include a controller 1120 for controlling the memory modules 1200a and 1200b and/or the storage devices 1300a and 1300b.

The controller 1120 may be the memory controller 200 of any one of FIGS. 1 through 17.

The main processor 1100 may further include an accelerator 1130, which is a dedicated circuit for a high-speed data operation such as an artificial intelligence (AI) data computation operation. The accelerator 1130 may include a graphic processing unit (GPU), a neural processing unit (NPU), and/or a data processing unit (DPU) and may be implemented as a separate chip physically independent of the other elements of the main processor 1100.

The memory modules 1200a and 1200b may be used as main memory devices of the memory system 1000 and may include nonvolatile memories such as SRAMs and/or DRAMs and nonvolatile memories such as flash memories, phase-change random-access memories (PRAMs), and/or resistive random-access memories (RRAMs). The memory modules 1200a and 1200b may be implemented in the same package as the main processor 1100. Each of the memory modules 1200a and 1200b may be the memory module 100 of any one of FIGS. 1 through 17.

The storage devices 1300a and 1300b may function as nonvolatile storage devices capable of storing data regardless of whether power is supplied and may have a larger storage capacity than the memory modules 1200a and 1200b. The storage devices 1300a and 1300b may include storage controllers 1310a and 1310b, respectively, and nonvolatile memories (NVMs) 1320a and 1320b, which store data under the control of the storage controllers 1310a and 1310b. The NVMs 1320a and 1320b may include two-dimensional (2D) or three-dimensional (3D) vertical NAND flash memories or may include other types of nonvolatile memories such as PRAMs and/or RRAMs.

The storage devices 1300a and 1300b may be included in the memory system 1000, physically separately from the main processor 1100, and may be implemented in the same package as the main processor 1100. Alternatively, the storage devices 1300a and 1300b may be implemented as solid state devices (SSDs) or memory cards and may thus be detachably coupled to the other elements of the memory system 1000 via an interface such as the connecting interface 1480. The storage devices 1300a and 1300b may be storage devices to which a standard such as Universal Flash Storage (UFS), embedded Multi-Media Card (eMMC), or Non-Volatile Memory express (NVMe) is applied, but the present disclosure is not limited thereto.

The image capturing device 1410 may capture a still or moving image and may be a camera, a camcorder, and/or a webcam.

The user input device 1420 may receive various types of data from the user and may be a touch pad, a keypad, a keyboard, a mouse, and/or a microphone.

The sensor 1430 may detect various physical quantities that can be acquired from outside the memory system 1000 and may convert the detected physical quantities into electric signals. The sensor 1430 may be a temperature sensor, a pressure sensor, an illumination sensor, a position sensor, an accelerometer sensor, a biosensor, and/or a gyroscope sensor.

The communication device 1440 may transmit signals to, or receive signals from, other devices outside the memory system 1000 in accordance with various communication standards. The communication device 1440 may be configured to include an antenna, a transceiver, and/or a modem.

The display 1450 and the speaker 1460 may function as output devices for outputting visual information and audio information, respectively, to the user.

The power supply device 1470 may appropriately convert power supplied from a battery (not illustrated) embedded in the memory system 1000 or from an external power source and may provide the power to the other elements of the memory system 1000.

The connecting interface 1480 may provide a connection between the memory system 1000 and an external device that may be connected to the memory system 1000 and may thus be able to exchange data with the memory system 1000. The connecting interface 1480 may be implemented as an Advanced Technology Attachment (ATA) interface, a Serial ATA (SATA) interface, an external SATA (e-SATA) interface, a Small Computer Small Interface (SCSI), a Serial Attached SCSI (SAS) interface, a Peripheral Component Interconnection (PCI) interface, a PCI express (PCIe) interface, an NVMe interface, an IEEE 1394 interface, a Universal Serial Bus (USB) interface, a secure digital (SD) card interface, a Multi-Media Card (MMC) interface, an eMMC interface, a UFS interface, an embedded Universal Flash Storage (eUFS) interface, or a compact flash (CF) card interface.

Figure 19:
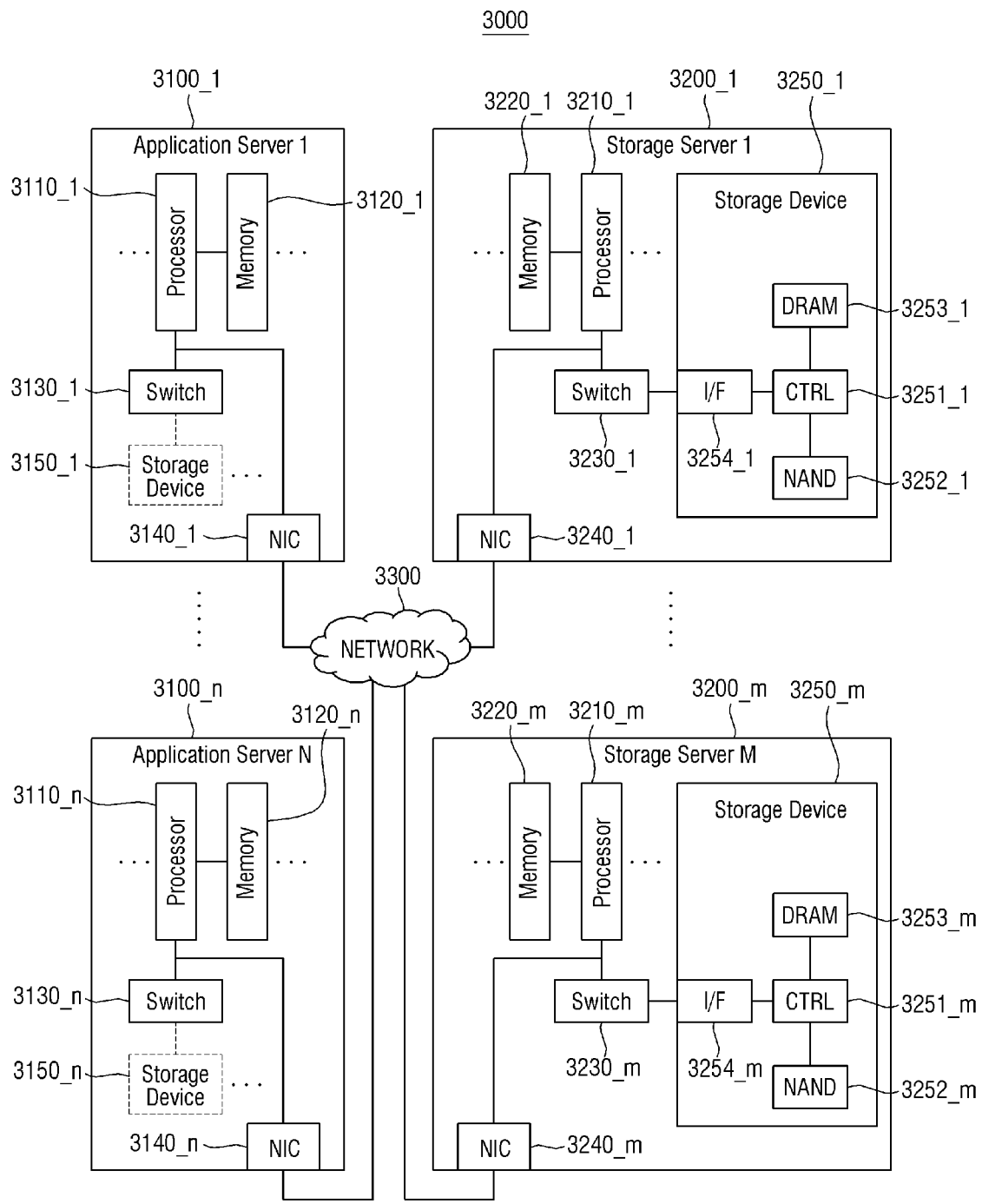
FIG. 19 is a block diagram illustrating a data center including one or more memory device(s) according to embodiments of the present disclosure.

FIG. 19 is a block diagram of a data center including one or more memory device(s) according to embodiments of the present disclosure.

Referring to FIG. 19, a data center 3000, which is a facility that collects various types of data and provides services, may also be referred to as a data storage center. The data center 3000 may be a system for operating a search engine and a database, and may be a computing system used in a business such as a bank or a government institution. The data center 3000 may include application servers 3100_1 through 3100_n and storage servers 3200_1 through 3200_m. The number of application servers 3100_1 through 3100_n and the number of storage servers 3200_1 through 3200_m may be varied and may be different from each other.

The application server 3100_1 may include at least one of a processor 3110_1 and a memory 3120_1, and the storage server 3200_1 may include at least one of a processor 3210_1 and a memory 3220_1. The processor 3210_1 may control the general operation of the storage server 3200_1 and may access the memory 3220_1 to execute instructions and/or data loaded in the memory 3220_1. The memory 3220_1 may be the memory module 100 of any one of FIGS. 1 through 17.

The memory 3220_1 may be a DDR SDRAM, a high-bandwidth memory (HBM), a hybrid memory cube (HMC), a dual in-line memory module (DIMM), an Optane DIMM, and/or a nonvolatile DIMM (NVDIMM). The numbers of processors 3210_1 and memories 3220_1 included in the storage server 3200_1 may be varied. The processor 3210_1 and the memory 3220_1 may provide a processor-memory pair. The number of processors 3210_1 and the number of memories 3220_1 may be different from each other. The processor 3210_1 may be a single-core processor or a multicore processor. The above description of the storage server 3200_1 may also be applicable to the application server 3100_1. The application server 3100_1 may not include a storage device 3150_1. The storage server 3200_1 may include at least one storage device 3250_1. The number of storage devices 3250_1 included in the storage server 3200_1 may be varied.

The application servers 3100_1 through 3100_n and the storage servers 3200_1 through 3200_m may communicate with one another via a network 3300. The network 3300 may be implemented using Fibre Channel (FC) or Ethernet. FC is a medium for use in high-speed data transmissions and may use optical switches providing high performance and high availability. The storage servers 3200_1 through 3200_m may be provided as file storages, block storages, or object storages depending on an access method of the network 3300.

The network 3300 may be a storage-only network such as a storage area network (SAN). For example, the SAN may be an FC-SAN that uses an FC network and is implemented in accordance with the FC (FCP). In another example, the SAN may be an IP-SAN that uses a TCP/IP network and is implemented in accordance with the SCSI over TCP/IP protocol or the Internet SCSI (iSCSI) protocol. In another example, the network 3300 may be a generic network such as a TCP/IP network. In another example, the network 3300 may be implemented in accordance with the FC over Ethernet (FCoE) protocol, the Network Attached Storage (NAS) protocol, or the NVMe over Fabrics (NVMe-oF) protocol.

The application server 3100_1 and the storage server 3200_1 will hereinafter be described. The description of the application server 3100_1 may also be applicable to the rest of the application servers 3100_1 through 3100_n, and the description of the storage server 3200 may also be applicable to the rest of the storage servers 3200_1 through 3200_m.

The application server 3100_1 may store data requested by the user or a client in one of the storage servers 3200_1 through 3200_m through the network 3300. Also, the application server 3100_1 may acquire data requested by the user or the client from one of the storage servers 3200_1 through 3200_m through the network 3300. For example, the application server 3100_1 may be implemented as a web server or a database management system (DBMS).

The application server 3100_1 may access a memory 3120_n or a storage device 3150_n of the application server 3100_n through the network 3300 or may access memories 3220_1 through 3220_m or storage devices 3250_1 through 3250_m of the storage servers 3200_1 through 3200_m through the network 3300. In this manner, the application server 3100_1 may perform various operations on data stored in the application servers 3100_1 through 3100_m and/or the storage servers 3200_1 through 3200_m. For example, the application server 3100_1 may execute an instruction to move or copy data between the application servers 3100_1 through 3100_n and/or between the storage servers 3200_1 through 3200_m. Here, the data may be transferred to the memories 3120_1 through 3120_n of the application servers 3100_1 through 3100_n directly or through the memories 3220_1 through 3220_m of the storage servers 3200_1 through 3200_m. Data transferred through the network 3300 may be encrypted data for security or privacy.

An interface 3254_1 of the storage server 3200_1 may provide a physical connection between the processor 3210_1 and a controller 3251_1 and a physical connection between a network interconnect (NIC) 3240_1 and the controller 3251_1. For example, the interface 3254_1 may be implemented as a direct attached storage (DAS) directly connected to the storage device 3250_1 via a dedicated cable. Also, for example, the interface 3254_1 may be implemented as an ATA interface, a SATA interface, an e-SATA interface, a SCSI, a SAS interface, a PCI interface, a PCIe interface, an NVMe interface, an IEEE 1394 interface, a USB interface, an SD card interface, an MMC interface, an eMMC interface, a UFS interface, an eUFS interface, or a CF card interface.

The storage server 3200_1 may further include a switch 3230_1 and the NIC 3240_1. The switch 3230_1 may selectively connect the processor 3210_1 and the storage device 3250_1 and the NIC 3240_1 and the storage device 3250_1 under the control of the processor 3210_1.

The NIC 3240_1 may include a network interface card, a network adaptor, and the like. The NIC 3240_1 may be connected to the network 3300 via a wired interface, a wireless interface, a Bluetooth interface, or an optical interface. The NIC 3240_1 may include an internal memory, a digital signal processor (DSP), a host bus interface, and the like and may be connected to the processor 3210_1 and/or the switch 3230_1 via the host bus interface. The host bus interface of the NIC 3240_1 may be implemented as one of the above-described examples of the interface 3254_1. The NIC 3240_1 may be incorporated with at least one of the processor 3210_1, the switch 3230_1, and the storage device 3250_1.

Processors 3210_1 through 3210_m of the storage servers 3200_1 through 3200_m or processors 3110_1 through 3110_n of the application servers 3100_1 through 3100_n may transmit commands to storage devices 3250_1 through 3250_m or memories 3220_1 through 3220_m of the storage servers 3200_1 through 3200_m or storage devices 3150_1 through 3150_n or memories 3120_1 through 3120_n of the application servers 3100_1 through 3100_n to program or read data. Here, the data may be error-corrected data provided by an ECC engine. The data may be obtained by data bus inversion (DBI) or data masking (DM) and may include cyclic redundancy code (CRC) information. The data may be encrypted data for security or privacy.

The storage devices 3150_1 through 3150_n or 3250_1 through 3250_m may transmit control signals and command/address signals to NAND flash memories 3252_1 through 3252_m in response to read commands received from the processors 3110_1 through 3110_n or 3210_1 through 3210_m. Accordingly, in a case where data is being read out from the NAND flash memory devices 3252_1 through 3252_m, read enable (RE) signals may be input as data output control signals to output data to a data bus DQ. Data strobe signals DQS may be generated using the RE signals. Commands and address signals may be latched to a page buffer in accordance with the rising edges or the falling edges of write enable (WE) signals.

The controller 3251_1 may be the controller 200 of any one of FIGS. 1 through 17. The controller 3251_1 may control the general operation of the storage device 3250_1.

The controller 3251_1 may include an SRAM. The controller 3251_1 may write data to the NAND flash memory 3252_1 in response to a write command or may read data from the NAND flash memory 3252_1 in response to a read command. For example, the write command and/or the read command may be provided by any one of the processors 3210_1 and 3210_m of the storage servers 3200_1 through 3200_m or any one of the processors 3110_1 through 3110_n of the application servers 3100_1 through 3100_n. A DRAM 3253_1 may temporarily store (or buffer) data to be written to, or read from, the NAND flash memory 3252_1. Also, the DRAM 3253_1 may store metadata. Here, the metadata may be user data or data generated by the controller 3251_1 for managing the NAND flash memory 3252_1. The storage device 3250_1 may include a secure element (SE) for security or privacy.

Although embodiments of the present disclosure have been described above with reference to the accompanying drawings, it will be understood by those of ordinary skill in the art that the present disclosure is not limited thereto and may be implemented in many different forms without departing from the technical idea or essential features thereof. Therefore, it should be understood that the embodiments set forth herein are merely examples in all respects and not restrictive.

What is claimed is:

1. A memory device comprising:
   a memory module including a memory array, wherein the memory array includes a plurality of memory cells; and
   a memory controller that retrieves read data from memory cells among the plurality of memory cells,
   wherein the memory controller includes a fault detector that detects faulty addresses associated with faulty memory cells among the memory cells providing data errors, and
   the fault detector comprises:
      a first inverter that generates inverted read data by reading and inverting the read data, wherein the inverted read data is stored in the memory array;
      a first buffer that stores the read data and provides buffered data;
      an XOR operator that receives the buffered data from the first buffer, receives read-out inverted data generated by reading the inverted read data stored in the memory array, and performs an XOR operation on the buffered data and the read-out inverted read data to generate calculation data;
      a fault address detection unit that identifies the faulty addresses in response to the calculation data and generates faulty address information;
      a second inverter that generates inverted read-out inverted read data by receiving and inverting the read-out inverted read data; and
      an error pattern change unit that converts an uncorrectable error (UE)-causing data into a correctable error (CE)-causing data.

2. The memory device of claim 1, wherein the memory controller further includes an error correction code (ECC) engine.

3. The memory device of claim 2, wherein the fault detector communicates at least one of the CE-causing data and faulty addresses information to the ECC engine.

4. The memory device of claim 1, wherein the memory controller further includes a second buffer that stores the faulty address information.

5. The memory device of claim 4, wherein the second buffer is a register.

6. The memory device of claim 4, wherein the memory controller generates syndrome data in response to the read data and stores the syndrome data in the second buffer, and if the syndrome data is a single-bit error, the faulty address information and the syndrome data are cleared from the second buffer.

7. The memory device of claim 1, wherein the memory module further includes a second buffer that stores the faulty address information and syndrome data generated in response to the read data.

8. A method of correcting data errors in read data generated by reading original data stored in memory cells of a memory array provided by a memory module using a memory controller including an error correction code (ECC) engine and a fault detector, the method comprising:

using the fault detector to generate faulty address information associated with faulty memory cells among the memory cells of the memory array by storing the read data in a first buffer to generate buffered read data, inverting the read data using a first inverter to generate inverted read data, storing the inverted read data in the memory array, reading the inverted read data from the memory array to generate read-out inverted read data, performing an XOR operation on the buffered read data and the read-out inverted read data to generate calculation data, and generating the faulty address information in response to the calculation data; and using the fault detector to convert uncorrectable error (UE)-causing data into correctable error (CE)-causing data by inverting the read-out inverted read data using a second inverter to generate inverted read-out inverted read data, and applying the inverted read-out inverted read data to an error pattern change unit, wherein the error pattern change unit converts the UE-causing data obtained by subtracting the original data from the read data into the CE-causing data obtained by subtracting the original data from the inverted read-out inverted read data.

9. The method of claim 8, further comprising:
providing the faulty address information and the CE-causing data to the ECC engine; and
using the ECC engine to correct the data errors in the read data using at least one of the faulty address information and the CE-causing data.

10. The method of claim 8, wherein the memory module includes a plurality of volatile memory chips arranged in at least one rank to implement the memory array, and
the memory controller further includes a memory interface between the memory controller and the memory module.

11. The method of claim 8, further comprising:
storing the faulty address information in a second buffer.

12. The method of claim 11, wherein the second buffer is a register external to the fault detector.

13. The method of claim 11, further comprising:
using the memory controller to generate syndrome data in response to the read data;
storing the syndrome data in the second buffer, and
if the syndrome data is a single-bit error, clearing the faulty address information and the syndrome data from the second buffer.

14. The method of claim 11, wherein the second buffer is a register internal to the fault detector.

15. A memory controller controlling operation of a memory module, the memory controller comprising:
a memory interface that controls communication of data between the memory controller and a memory array provided by the memory module;
a first buffer that stores read data generated by reading original data stored in the memory array and provides buffered read data;
an error correction code (ECC) engine that corrects data errors in the read data retrieved from the memory array; and
a fault detector that generates faulty address information identifying faulty addresses of faulty memory cells in the memory array producing the data errors,
wherein the fault detector includes:
a first inverter that generates inverted read data by inverting the read data, wherein the inverted read data is stored in the memory array;
an XOR operator that receives the buffered data from the first buffer, receives read-out inverted data generated by reading the inverted read data stored in the memory array, and performs an XOR operation on the buffered data and the read-out inverted read data to generate calculation data; and
a fault address detection unit that identifies the faulty addresses in response to the calculation data and generates the faulty address information.

16. The memory controller of claim 15, further comprising:
a second inverter that generates inverted read-out inverted read data by inverting the read-out inverted read data; and
an error pattern change unit that converts uncorrectable error (UC)-causing data obtained by subtracting the original data from the read data into correctable error (CE)-causing data obtained by subtracting the original data from the inverted read-out inverted read data.

17. The memory controller of claim 15, wherein the ECC engine corrects the data errors in the read data in response to at least one of the faulty address information and the CE-causing data.

18. The memory controller of claim 15, further comprising:
a second buffer internal to the fault detector that stores the faulty address information.

19. The memory controller of claim 15, further comprising:
a second buffer external to the fault detector that stores the faulty address information.

20. The memory controller of claim 15, further comprising:
a second buffer that stores the faulty address information,
wherein the memory controller generates syndrome data in response to the read data and stores the syndrome data in the second buffer, and if the syndrome data is a single-bit error (SBE), the faulty address information is and the syndrome data are cleared from the second buffer.

* * * * *